(12) United States Patent
Nakashiba

(10) Patent No.: US 9,105,501 B2
(45) Date of Patent: Aug. 11, 2015

(54) SEMICONDUCTOR DEVICE, METHOD OF MANUFACTURING THEREOF, SIGNAL TRANSMISSION/RECEPTION METHOD USING SUCH SEMICONDUCTOR DEVICE, AND TESTER APPARATUS

(71) Applicant: RENESAS ELECTRONICS CORPORATION, Kawasaki-shi (JP)

(72) Inventor: Yasutaka Nakashiba, Kawasaki (JP)

(73) Assignee: RENESAS ELECTRONICS CORPORATION, Kawasaki-Shi, Kanagawa (JP)

( * ) Notice: Subject to any disclaimer, the term of this patent is extended or adjusted under 35 U.S.C. 154(b) by 0 days.

(21) Appl. No.: 14/279,603

(22) Filed: May 16, 2014

(65) Prior Publication Data

US 2014/0246743 A1  Sep. 4, 2014

Related U.S. Application Data

(63) Continuation of application No. 13/711,178, filed on Dec. 11, 2012, now Pat. No. 8,729,651, which is a continuation of application No. 12/320,054, filed on Jan. 15, 2009, now Pat. No. 8,334,759.

(30) Foreign Application Priority Data

Jan. 29, 2008 (JP) .................................. 2008-17285

(51) Int. Cl.
*H01L 49/02* (2006.01)
*G01R 31/302* (2006.01)
(Continued)

(52) U.S. Cl.
CPC .............. *H01L 28/10* (2013.01); *G01R 31/303* (2013.01); *G01R 31/3025* (2013.01);
(Continued)

(58) Field of Classification Search
CPC .............................. H01L 28/10; H01L 23/645
See application file for complete search history.

(56) References Cited

U.S. PATENT DOCUMENTS 6,194,961 B1   2/2001   Passeraub
7,193,263 B2   3/2007   Barth
(Continued)

FOREIGN PATENT DOCUMENTS

JP   2002-246547 A   8/2002
JP   2005-30877 A    2/2005
(Continued)

OTHER PUBLICATIONS

Chinese Office Action dated Oct. 24, 2011 (with an English translation).
(Continued)

*Primary Examiner* — Whitney T Moore
(74) *Attorney, Agent, or Firm* — McGinn IP Law Group, PLLC

(57) ABSTRACT

A semiconductor device includes a substrate, an internal circuit including a plurality of transistors provided over the substrate, an insulating film provided over the substrate, a bonding pad provided over the insulating film, an inductor being formed in the insulating film, the inductor carrying out a signal transmission/reception to/from an external device in a non-contact manner by an electromagnetic induction and being electrically coupled to the internal circuit. The inductor includes a first conducting layer, and the bonding pad includes a second conducting layer. The first conducting layer includes a lower level layer than the second conducting layer in a thickness direction of the substrate. In a plan view, the inductor includes a first portion overlapping the bonding pad and a second portion not overlapping the bonding pad.

5 Claims, 8 Drawing Sheets

(51) Int. Cl.
  *G01R 31/303* (2006.01)
  *H01L 23/48* (2006.01)
  *H01L 23/64* (2006.01)
  *G01R 31/28* (2006.01)
  *H01L 23/00* (2006.01)

(52) U.S. Cl.
  CPC .............. *H01L 23/48* (2013.01); *H01L 23/645* (2013.01); *G01R 31/2886* (2013.01); *H01L 24/05* (2013.01); *H01L 24/48* (2013.01); *H01L 2224/48* (2013.01); *H01L 2924/01004* (2013.01); *H01L 2924/10253* (2013.01); *H01L 2924/14* (2013.01); *H01L 2924/19042* (2013.01); *H01L 2924/19043* (2013.01); *H01L 2924/3025* (2013.01); *H01L 2924/30107* (2013.01)

(56) References Cited

U.S. PATENT DOCUMENTS

| | | | |
|---|---|---|---|
| 7,355,270 | B2 | 4/2008 | Hasebe et al. |
| 8,232,880 | B2 | 7/2012 | Yamazaki et al. |
| 2005/0173532 | A1 | 8/2005 | Hasebe et al. |
| 2005/0199934 | A1 | 9/2005 | Barth |
| 2006/0157701 | A1 | 7/2006 | Bauer et al. |
| 2007/0296055 | A1 | 12/2007 | Yen et al. |
| 2008/0044977 | A1 | 2/2008 | Lin |
| 2008/0290457 | A1 | 11/2008 | Ker et al. |
| 2009/0140359 | A1 | 6/2009 | Nakashiba |
| 2009/0261897 | A1 | 10/2009 | Bobde |

FOREIGN PATENT DOCUMENTS

| | | |
|---|---|---|
| JP | 2005-228785 A | 8/2005 |
| JP | 2005-311331 A | 11/2005 |
| JP | 2006-504274 A | 2/2006 |
| JP | 2007-73600 A | 3/2007 |
| JP | 2007-73812 A | 3/2007 |
| JP | 2007-134694 A | 5/2007 |
| JP | 2007-221036 A | 8/2007 |
| TW | 200802120 A | 1/2008 |

OTHER PUBLICATIONS

Office Action dated Nov. 22, 2010 in U.S. Appl. No. 12/320,054.
Office Action dated Apr. 19, 2011 in U.S. Appl. No. 12/320,054.
Office Action dated Aug. 12, 2011 in U.S. Appl. No. 12/320,054.
Office Action dated Nov. 28, 2011 in U.S. Appl. No. 12/320,054.
Office Action dated Mar. 23, 2012 in U.S. Appl. No. 12/320,054.
Notice of Allowance dated Aug. 16, 2012 in U.S. Appl. No. 12/320,054.
Japanese Notification of Reasons for Refusal dated Feb. 5, 2013 with English translation thereof.
U.S. Office Action dated May 13, 2013 in U.S. Appl. No. 13/711,178.
U.S. Office Action dated Oct. 21, 2013 in U.S. Appl. No. 13/711,178.
Notice of Allowance dated Jan. 13, 2014 U.S. Appl. No. 13/711,178.
Japanese Office Action dated Sep. 24, 2014 with English Translation.
Chinese Office Action dated Jan. 13, 2015 with English Translation.

SEMICONDUCTOR DEVICE, METHOD OF MANUFACTURING THEREOF, SIGNAL TRANSMISSION/RECEPTION METHOD USING SUCH SEMICONDUCTOR DEVICE, AND TESTER APPARATUS

The present application is a Continuation Application of U.S. patent application Ser. No. 13/711,178, filed on Dec. 11, 2012, which is based on and claims priority from U.S. patent application Ser. No. 12/320,054, filed on Jan. 15, 2009, now U.S. Pat. No. 8,334,759 B2, which is based on and claims priority from Japanese patent application No. 2008-17285, filed on Jan. 29, 2008, the entire contents of which are incorporated herein by reference.

BACKGROUND OF THE INVENTION

1. Field of the Invention

The present invention relates to a semiconductor device, a method of manufacturing thereof, a signal transmission/reception method using such a semiconductor device, and a tester apparatus.

2. Description of Related Art

In recent years, semiconductor devices are known which conduct data communication by wireless communication.

Japanese Patent Application Laid-open No. 2007-134694 discloses a semiconductor device for communicating data by an electromagnetic induction system. The semiconductor device has a coil antenna and a semiconductor integrated circuit connected to the coil antenna. When a coil antenna connected to a reader/writer is brought close to the semiconductor device, the coil antenna connected to the reader/writer generates an AC magnetic field. The AC magnetic field penetrates the coil antenna in the semiconductor device. An electromotive force is generated between terminals of the antenna by electromagnetic induction, and the semiconductor integrated circuit in the semiconductor device operates.

Japanese Patent Application Laid-open No. 2005-311331 discloses a structure in which an integrated circuit and an antenna are formed on the same substrate, and a conductive wire or a conductive film included in the antenna is formed in two layers so as to sandwich the substrate having the integrated circuit formed thereon. Therein, an example is described in which the two layers of the conductive wire are an antenna for supplying power to the integrated circuit and an antenna for transmitting/receiving a signal, respectively.

Japanese Patent Application Laid-open No. 2005-228785 discloses a structure in which a coil antenna is disposed in a region outside an outer periphery of a circuit of a semiconductor chip. Japanese Patent Application Laid-open No. 2005-30877 discloses a technique in which a built-in test circuit and a wireless communication circuit are mounted in a semiconductor integrated circuit device, and the built-in test circuit is controlled by a radio signal to conduct a test.

On the other hand, Japanese Patent Translation Publication No. 2006-504274 discloses a structure in which a conductive structure is provided as a passive component for mechanically stabilizing an insulation layer against mechanical force in bonding a conductive bonding pad layer. Here, the passive component included in an analog circuit is provided under the bonding pad layer, and a screening layer for preventing coupling of the passive component and the bonding pad layer is provided between the passive component and the bonding pad layer.

The present inventor has recognized as follows. Conventionally, in order to test an internal circuit at a wafer level of a semiconductor device, power is supplied through probing with a probe to a pad for a power source on a surface of a chip of the semiconductor device, and a signal is transmitted/received with a pad for a signal via a probe to test operation of the internal circuit. However, the pad is scratched by a needle of the probe during a probe test, which causes poor connection in bonding the pad later, or, which causes contamination due to shavings of the pad. Further, as the chip size decreases and as the number of pads per chip increases, the pad size and the pitch between the pads decrease, and thus, satisfactory electrical connection between multiple pads and corresponding multiple probe needles becomes difficult accordingly.

In order to avoid such problems, it is preferred to carry out power supply and signal transmission/reception with respect to the internal circuit in a non-contact manner. However, in order to carry out transmission/reception of various kinds of signals from/to the internal circuit using, for example, electromagnetic induction instead of a plurality of pads so as to correspond to input/output signals to/from the plurality of pads, multiple inductors are necessary, and thus, a large footprint is necessary for the inductors. As disclosed in Japanese Patent Application Laid-open Nos. 2007-134694, 2005-311331, and 2005-228785, in a structure in which a coil antenna for signal transmission/reception is disposed on an outer periphery of a chip, multiple antennas can not be disposed. Further, in the technique disclosed in Japanese Patent Application Laid-open No. 2005-30877, only a case in which one coil for an antenna is disposed with respect to one chip is assumed, and a carrier wave of a radio signal input from the external is used to generate power. Still further, in the passive component disclosed in Japanese Patent Translation Publication No. 2006-504274, a radio signal is not assumed to be input/output from/to the external and the screening layer is provided between the passive component and the bonding pad layer such that a signal can not be input/output from/to the external.

SUMMARY

According to an aspect of the present invention, there is provided a semiconductor device, including:

a substrate;

a bonding pad provided above the substrate; and a first signal transmitting/receiving portion provided above the substrate and below the bonding pad for carrying out signal transmission/reception to/from an external in a non-contact manner by electromagnetic induction.

According to another aspect of the present invention, there is provided a signal transmission/reception method including:

bringing close to a semiconductor device an external device in a non-contact manner, the semiconductor device including a substrate, a bonding pad provided above the substrate, and a first signal transmitting/receiving portion provided above the substrate and below the bonding pad for carrying out signal transmission/reception to/from an external in a non-contact manner by electromagnetic induction, the external device including a first external signal transmitting/receiving portion provided at a location corresponding to the first signal transmitting/receiving portion for carrying out signal transmission/reception to/from the first signal transmitting/receiving portion in a non-contact manner by electromagnetic induction; and carrying out the signal transmission/reception between the first external signal transmitting/receiving portion and the first signal transmitting/receiving portion.

According to still another aspect of the present invention, there is provided a method of manufacturing a semiconductor device, including:

bringing close to the semiconductor device an external device in a non-contact manner, the semiconductor device including a substrate having a chip formation region and a scribe line region provided on an outer periphery of the chip formation region, a bonding pad provided above the substrate, and a first signal transmitting/receiving portion provided above the substrate and below the bonding pad for carrying out signal transmission/reception to/from an external in a non-contact manner by electromagnetic induction, the external device including a first external signal transmitting/receiving portion provided at a location corresponding to the first signal transmitting/receiving portion for carrying out signal transmission/reception to/from the first signal transmitting/receiving portion in a non-contact manner by electromagnetic induction;

carrying out the signal transmission/reception between the first external signal transmitting/receiving portion and the first signal transmitting/receiving portion;

cutting the semiconductor device along the scribe line region into chips; and connecting the bonding pad to an external terminal via a bonding wire in each of the chips formed by cutting the semiconductor device.

With such a structure, the chip size is not required to be increased in order to provide the signal transmitting/receiving portion. Further, the signal transmitting/receiving portion and the bonding pad can be efficiently disposed, and increase in chip size can be suppressed. Here, the signal transmitting/receiving portion can be provided instead of a pad for probing with a probe when a test of an internal circuit of the semiconductor device is conducted at a wafer level. Conventionally, it is necessary to provide a region for the probe and a region for wire bonding in a bonding pad, which increases the size of the bonding pad. However, according to the structure of the present invention, because it is not necessary to provide the region for a probe, the area of the bonding pad can be decreased, and, as a whole, increase in chip size can be greatly suppressed.

According to still another aspect of the present invention, there is provided a tester apparatus for testing a semiconductor device, the semiconductor device including a substrate, a bonding pad provided above the substrate, and a first signal transmitting/receiving portion provided above the substrate and below the bonding pad for carrying out signal transmission/reception to/from an external in a non-contact manner by electromagnetic induction, the tester apparatus including a first external signal transmitting/receiving portion provided at a location corresponding to the first signal transmitting/receiving portion for carrying out signal transmission/reception to/from the first signal transmitting/receiving portion in a non-contact manner by electromagnetic induction.

By using a tester with such a structure, a signal transmitting/receiving portion provided instead of a pad for probing with a probe when a test of an internal circuit is conducted at a wafer level can be used to conduct a test of the semiconductor device in a non-contact manner.

It is to be noted that arbitrary combinations of the above-mentioned components, and the implementation of the present invention in the form of a method, an apparatus, or the like are also effective as embodiments of the present invention.

According to the present invention, increase in chip size can be suppressed when signal transmission/reception to/from the external is carried out in a non-contact manner.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF PREFERRED EMBODIMENTS

Figure 1:
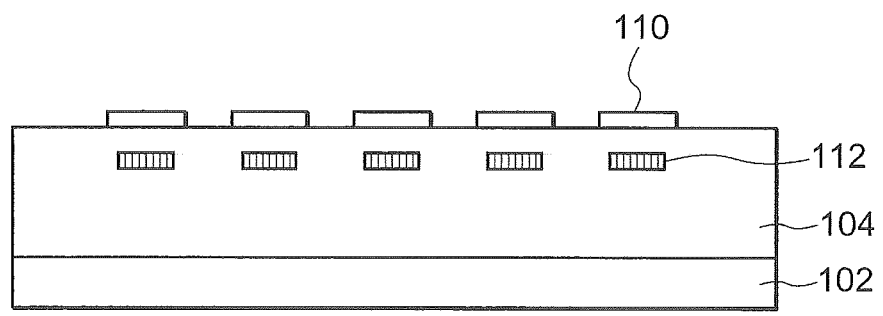
FIG. 1 is a sectional view illustrating an exemplary structure of a semiconductor device according to a first embodiment of the present invention.

With reference to the attached drawings, embodiments of the present invention are now described. It is to be noted that like or identical constituting elements are denoted by like reference numerals throughout the drawings, and description thereof is omitted as appropriate.

In the embodiments of the present invention, a case is described as an example in which a signal transmitting/receiving portion is provided instead of a pad provided for the purpose of probing with a probe when a test of an internal circuit of a semiconductor device is conducted at a wafer level. When a test of an internal circuit of a semiconductor device is conducted at a wafer level, the signal transmitting/receiving portion transmits/receives various kinds of test signals to/from an external tester by short distance communication in a non-contact manner. In the embodiments of the present invention, the signal transmitting/receiving portion may be an inductor.

Figure 2:
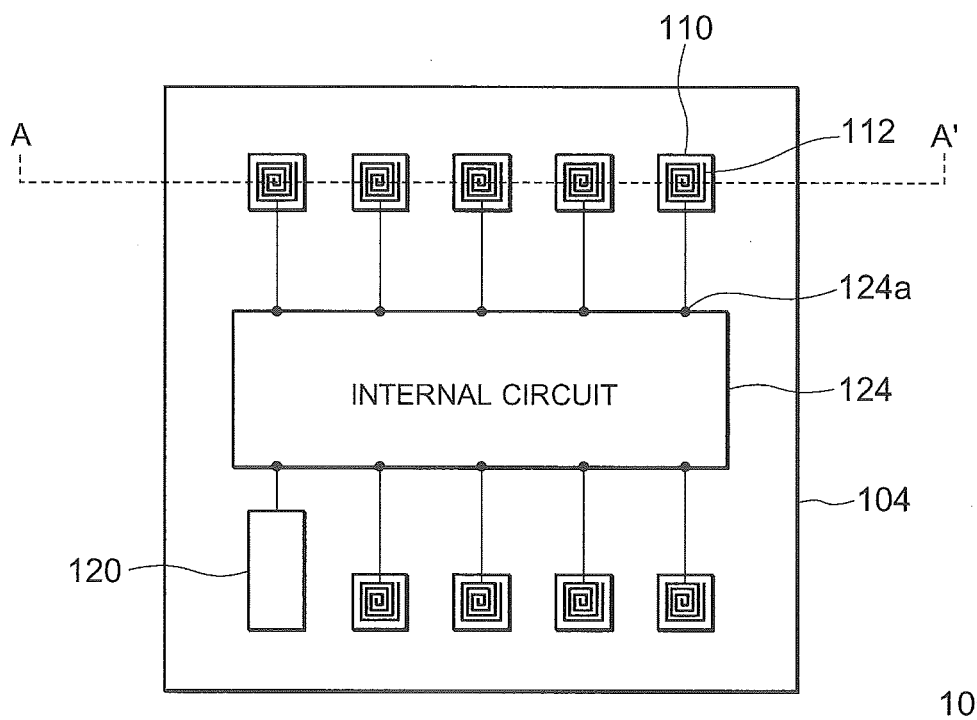
FIG. 2 is a plan view of the semiconductor device illustrated in FIG. 1.
Figure 3:
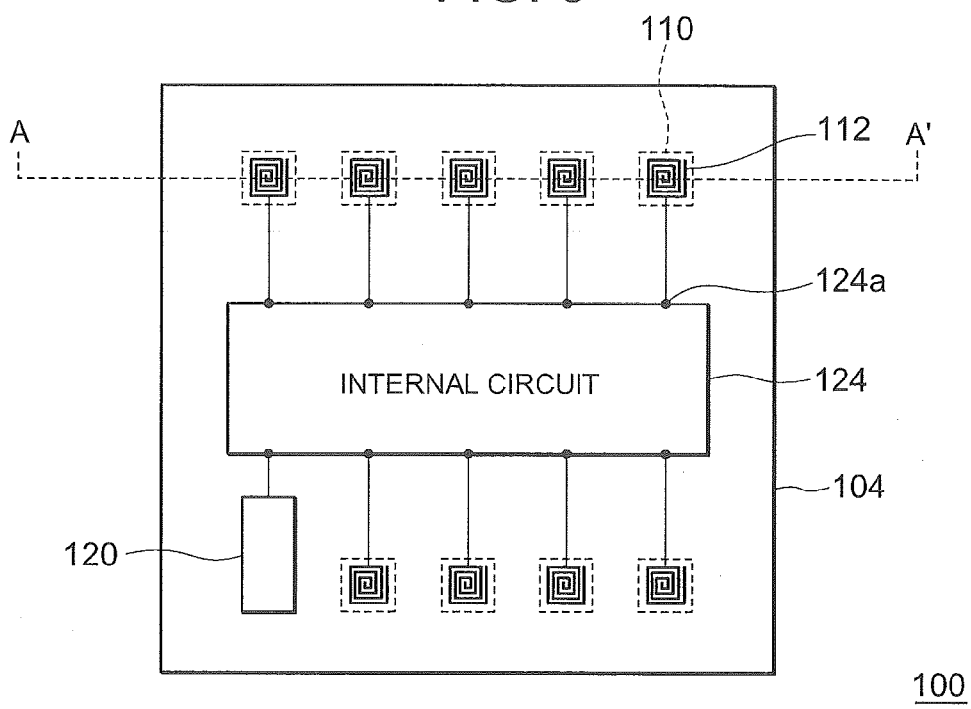
FIG. 3 is another plan view of the semiconductor device illustrated in FIG. 1.

FIGS. 1 to 3 illustrate an exemplary structure of a semiconductor device 100 according to a first embodiment of the present invention. FIG. 1 is a sectional view of the semiconductor device 100 and FIGS. 2 and 3 are plan views of the semiconductor device 100. FIG. 1 is a sectional view taken along the line A-A' of FIG. 2 and FIG. 3.

As illustrated in FIG. 1, the semiconductor device 100 includes a semiconductor substrate 102 (substrate) and an insulating film 104 provided on the semiconductor substrate 102. The semiconductor device 100 also includes inductors 112 (first signal transmitting/receiving portion) provided in the insulating film 104 on the semiconductor substrate 102, and bonding pads 110 provided above the semiconductor substrate 102 so as to be superimposed on the inductors 112. Here, the semiconductor device 100 may be in a state before the semiconductor substrate 102 is divided into chips. The semiconductor substrate 102 may be, for example, a semiconductor wafer such as a silicon wafer.

The inductors 112 carry out signal transmission/reception to/from an external in a non-contact manner by electromagnetic induction. The inductors 112 may be provided instead of pads provided in a conventional semiconductor device for the purpose of probing with a probe when a test of an internal circuit is conducted at a wafer level. Conventionally, when probing is conducted with a probe, the pad is scratched, and, when bonding is carried out at the scratched portion, poor connection of the bonding is caused. Therefore, it is necessary to provide a region for a probe and a region for wire bonding, which increases the size of the pad. On the other hand, according to this embodiment, the bonding pads 110 is required to include only a region for wire bonding, and hence the size of the pads may be smaller than that of conventional pads. Further, the inductors 112 are formed to be smaller than the bonding pads 110 in a plan view, and thus it is not necessary to make the chip size larger in order to provide the inductors 112. It is to be noted that, according to this embodiment, the inductors 112 may be formed of a conductor which is formed of a single layer. This enables reducing the size of the inductors 112.

The bonding pads 110 are provided on a surface of the semiconductor device 100 in preparation for wire bonding to be carried out later. The bonding pads 110 are, after the semiconductor substrate 102 is cut into chips, mounted on another substrate such as a motherboard, and are connected to terminals of the substrate via bonding wires (not shown). A signal from the external is input to the bonding pads 110 via the bonding wires. In this embodiment, the bonding pads 110 are provided on the insulating film 104 and are exposed on the surface of the semiconductor device 100.

FIG. 2 is a plan view schematically illustrating the surface of the semiconductor device 100.

It is to be noted that, only one chip formation region is illustrated here, but the semiconductor device 100 may include a plurality of similar chip formation regions surrounded by a scribe line.

The semiconductor device 100 further includes an internal circuit 124 formed on the semiconductor substrate 102 and a power supply circuit 120. The internal circuit 124 includes a plurality of input/output terminals 124a. In this embodiment, an inductor 112 and a corresponding bonding pad 110 superimposed on the inductor 112 may be adapted to be connected to an identical input/output terminal 124a of the internal circuit 124. Further, the power supply circuit 120 is connected to any one of the input/output terminals 124a of the internal circuit 124.

Here, the inductors 112 are illustrated by solid lines in order to clarify a relationship between the bonding pads 110 and the inductors 112 in the plan view. However, actually, the inductors 112 are provided in a layer which is different from a layer in which the bonding pads 110 are provided. Further, the power supply circuit 120 and the internal circuit 124 are also illustrated by solid lines, but, actually, the power supply circuit 120 and the internal circuit 124 may also be provided in a layer which is different from the layer in which the bonding pads 110 are provided. The internal circuit 124 may be adapted to include, for example, a transistor.

FIG. 3 is a plan view schematically illustrating a structure of the layer in which the inductors 112 of the semiconductor device 100 are provided. The inductors 112 may be in a coil shape. Here, in order to clarify the relationship between the bonding pads 110 and the inductors 112 in the plan view, the bonding pads 110 are illustrated by broken lines. Further, the power supply circuit 120 and the internal circuit 124 are illustrated by solid lines, but, actually, the power supply circuit 120 and the internal circuit 124 may be provided in a layer which is different from the layer in which the inductors 112 are provided.

For example, in the example illustrated in FIGS. 2 and 3, nine bonding pads 110 are provided on the surface of the semiconductor device 100, and one inductor 112 is provided under each of the bonding pads 110. The input/output terminals 124a of the internal circuit 124 are connected to pairs of the bonding pads 110 and the inductors 112, respectively.

The size of the inductors 112 may be substantially the same as that of the bonding pads 110 in the plan view. Specifically, the inductors 112 may be provided such that the size thereof is not excessively large with respect to the size of the bonding pads 110. This can suppress increase in chip size due to provision of the inductors 112. In this embodiment, the area occupied by each inductor 112 is smaller than the area occupied by each bonding pad 110. It is to be noted that, the bonding pads 110 are required to include only the region for wire bonding, and hence the size of the bonding pads 110 can be smaller than the size of conventional bonding pads. Such a structure described above makes it possible to efficiently dispose the bonding pads 110 and the inductors 112, and the increase in chip size can be suppressed.

Figure 4:
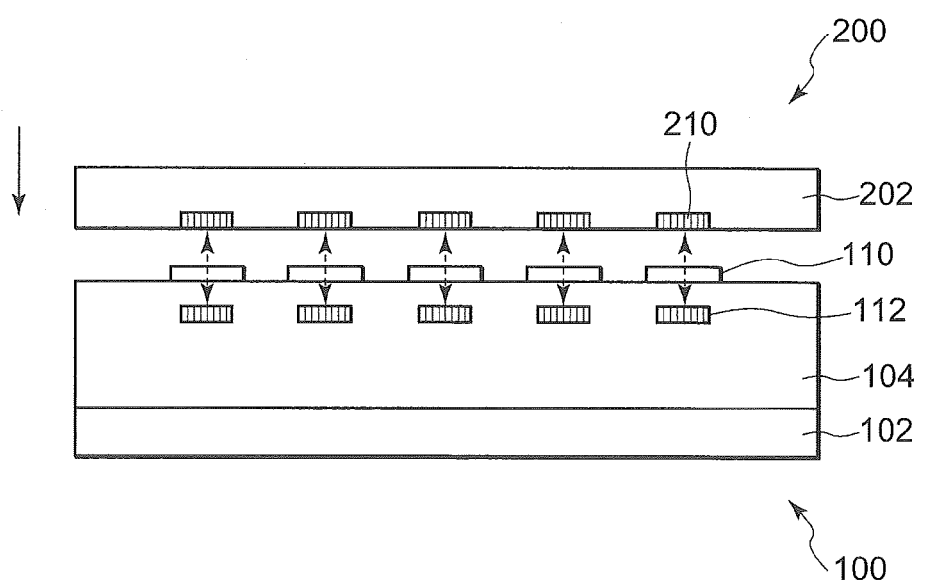
FIG. 4 is a sectional view illustrating a structure of the semiconductor device illustrated in FIG. 1 and a tester for transmitting/receiving a signal to/from the semiconductor device.

FIG. 4 is a sectional view illustrating a structure of a tester 200 for supplying a signal to the semiconductor device 100 and the semiconductor device 100.

The tester 200 includes a substrate 202 on a tester side and a plurality of inductors 210 on the tester side. The plurality of inductors 210 on the tester side are provided at locations corresponding to the plurality of inductors 112 of the semiconductor device 100, respectively.

Figure 5:
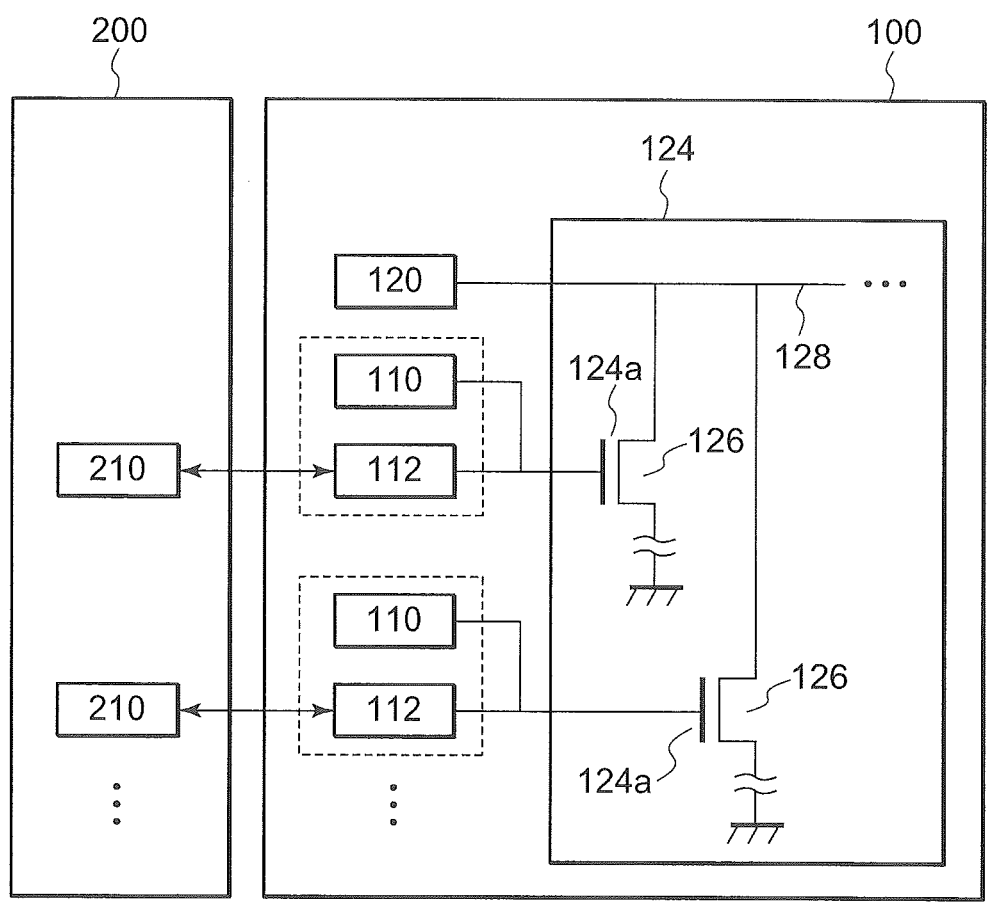
FIG. 5 is a block diagram illustrating an exemplary structure of the semiconductor device and the tester.

FIG. 5 is a block diagram illustrating an exemplary structure of the semiconductor device 100 and the tester 200.

The internal circuit 124 may include a plurality of transistors 126 corresponding to the plurality of inductors 112. Gates of the transistors 126 are connected to the pairs of the bonding pads 110 and the inductors 112, respectively. Here, a bonding pad 110 may be provided so as to be superimposed on an inductor 112 surrounded by an identical broken line which surrounds the bonding pad 110. The gates of the transistors 126 correspond to the input/output terminals 124a, respectively.

One of a source and a drain of each of the transistors 126 is grounded, and the other is connected to the power supply circuit 120 via a power supply line 128. A rear surface of the semiconductor substrate 102 may be grounded such that the one of the source and the drain of each of the transistors 126 is grounded by being connected to the rear surface of the semiconductor substrate 102.

Next, with reference to FIGS. 4 and 5, operation when a test of the internal circuit 124 of the semiconductor device 100 is conducted at a wafer level in this embodiment is described.

First, the tester 200 is brought close to one of the chips of the semiconductor device 100 in a non-contact manner so that the inductors 210 on the tester side of the tester 200 are opposed to the inductors 112 of the semiconductor device 100, respectively. Then, radio waves having predetermined frequencies are output from the inductors 210 on the tester side, respectively, of the tester 200 to the semiconductor device 100. Here, test signals are output from the inductors 210 on the tester side, and power supply voltage is supplied from the power supply circuit 120 to the internal circuit 124.

The inductors 112 of the semiconductor device 100 convert signals output from the inductors 210 on the tester side into AC electrical signals. Although not shown in FIGS. 4 and 5, the semiconductor device 100 may be adapted to include conversion circuits which correspond to the inductors 112, respectively. In this case, the inductors 112 may be adapted to be connected to the input/output terminals 124a via the conversion circuits, respectively. The conversion circuits demodulate the AC electrical signals converted by the inductors 112 and supply the demodulated signals to the internal circuit 124. When a signal is output from the semiconductor device 100 to the tester 200, an electrical signal supplied by the internal circuit 124 is modulated by the conversion circuits and is supplied to the inductors 112. The inductors 112 output the modulated signals as radio waves to corresponding inductors 210 on the tester side of the tester 200, respectively. In this way, data is transmitted/received between the semiconductor device 100 and the tester 200.

After a test of the internal circuit 124 is conducted at a wafer level as described above, the semiconductor device 100 is cut along scribe line regions into chips. In each of the chips formed by cutting the semiconductor device 100, by connecting the bonding pads 110 to external terminals via the bonding wires, a semiconductor package is formed. After that, signals are input from the external via the bonding wires, respectively, and the signals are input to the internal circuit 124. In this embodiment, an inductor 112 and a corresponding bonding pad 110 superimposed on the inductor 112 are connected to an identical input/output terminal 124a of the internal circuit 124. Therefore, when a test of the internal circuit 124 is conducted at a wafer level, signals may be adapted to be input/output to/from the input/output terminals 124a via the inductors 112, respectively, and, after the chips are formed, signals may be adapted to be input/output to/from the input/output terminals 124a via the bonding pads 110, respectively. This makes it possible to use the inductors 112 instead of pads conventionally provided for the purpose of probing with a probe when a test of the internal circuit is conducted at a wafer level.

As described above, according to this embodiment, when a test of the internal circuit 124 is conducted at a wafer level, unlike a conventional case in which a probe is used to probe the bonding pads 110, the tester 200 including the inductors 210 on the tester side is used to transmit/receive signals to/from the inductors 112 of the semiconductor device 100 in a non-contact manner. The signals transmitted/received between the tester 200 and the inductors 112 of the semiconductor device 100 are input/output to/from the internal circuit 124 via the inductors 112. After the test is completed and the semiconductor device 100 is cut into chips, the bonding pads 110 are connected to the external terminals via the bonding wires, respectively. The signals transmitted/received to/from the external terminals are input/output to/from the internal circuit 124 via the bonding wires and the bonding pads 110, respectively. Specifically, in this embodiment, the inductors 112 are provided for the purpose of inputting/outputting signals transmitted/received to/from an external device such as the tester 200 to/from the internal circuit 124. Therefore, the inductors 112 are adapted to transmit/receive the signals to/from the external device in a non-contact manner. More specifically, in this embodiment, no member which interrupts signal transmission/reception to/from the inductors 112 may be adapted to be provided between the bonding pads 110 and the inductors 112.

Next, effects of the semiconductor device 100 according to this embodiment are described.

According to the structure of the semiconductor device 100 of this embodiment, the inductors 112 and the bonding pads 110 can be efficiently disposed, which can suppress the increase in chip size. In particular, it is not necessary to make larger the chip size in order to dispose inductors serving as terminals used only for non-contact testing at a wafer level. Further, the size of the bonding pads 110 can also be made smaller, and, as a whole, the increase in chip size can be greatly suppressed.

Further, the inductors 112 according to this embodiment can be formed of a conductor which is formed of a single layer, which enables compactness. In this embodiment, the inductors 112 are used for short distance communication, and hence a very high Q value is not necessary, and thus, even if the inductors 112 are formed of a conductor which is formed of a single layer, signals can be transmitted/received without any problems.

Next, other embodiments of the semiconductor device 100 according to the present invention are described.

Figure 6:
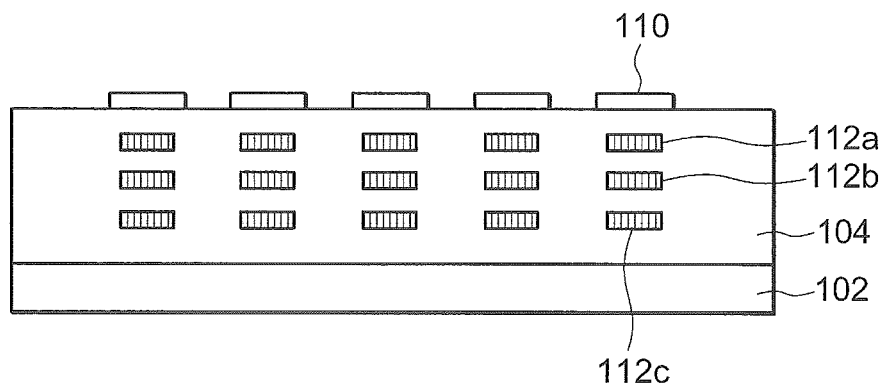
FIG. 6 is a sectional view illustrating an exemplary structure of a semiconductor device according to a second embodiment of the present invention.

FIG. 6 is a sectional view illustrating an exemplary structure of a semiconductor device 100 according to a second embodiment of the present invention.

This embodiment is different from the embodiment described with reference to FIGS. 1 to 5 in that a plurality of inductors are provided under each of the bonding pads 110.

An inductor 112c, an inductor 112b, and an inductor 112a are stacked above the semiconductor substrate 102 in this order. The inductor 112c, the inductor 112b, and the inductor 112a may be inductors which are independent of one another such that phases of signals detected by the respective inductors are different from one another. Here, a plurality of inductors (inductor 112c, inductor 112b, and inductor 112a) are provided similarly under each of the bonding pads 110.

Figure 7:
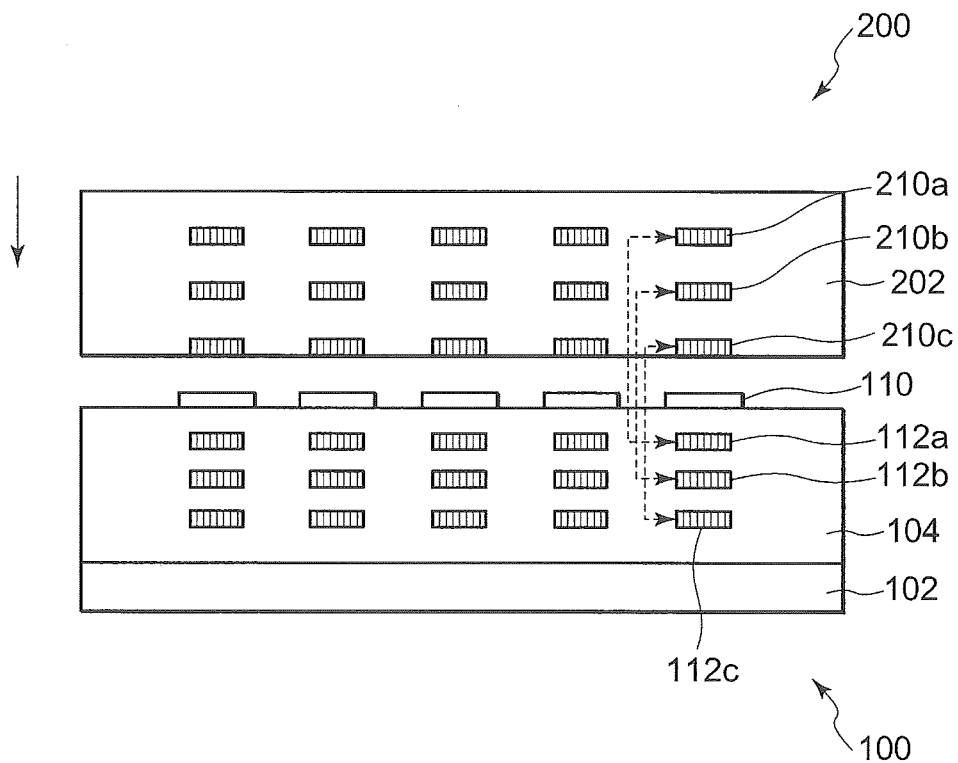
FIG. 7 is a sectional view illustrating a structure of the semiconductor device illustrated in FIG. 6 and a tester for transmitting/receiving a signal to/from the semiconductor device.

FIG. 7 is a sectional view illustrating a structure of a tester 200 for supplying a signal to the semiconductor device 100 and the semiconductor device 100 according to the second embodiment of the present invention.

When the semiconductor device 100 has the structure as illustrated in FIG. 6, the tester 200 also includes a plurality of inductors provided so as to be stacked at locations corresponding to the stacked inductors of the semiconductor device 100. Specifically, the tester 200 includes a plurality of inductors, i.e., an inductor 210c on the tester side, an inductor 210b on the tester side, and an inductor 210a on the tester side which are stacked in the substrate 202 in this order so as to be superimposed on one another in the plan view. Here, the inductor 210c on the tester side, the inductor 210b on the tester side, and the inductor 210a on the tester side may be adapted to correspond to the inductor 112c, the inductor 112b, and the inductor 112a of the semiconductor device 100, respectively. More specifically, the inductor 210c on the tester side and the inductor 112c may be adapted to transmit/receive a signal having the same phase, the inductor 210b on the tester side and the inductor 112b may be adapted to transmit/receive a signal having the same phase, and the inductor 210a on the tester side and the inductor 112a may be adapted to transmit/receive a signal having the same phase. Even in such a case described above in which the plurality of inductors are disposed so as to be stacked, by shifting the phases of the signals to be transmitted/received, interference among the inductors can be prevented.

It is to be noted that, as illustrated in this embodiment, when the plurality of inductors 112a to 112c are adapted to be stacked under each of the bonding pads 110, it is not necessary that all of the stacked inductors 112a to 112c be connected to the input/output terminals 124a of the internal circuit 124 connected to the corresponding bonding pads 110, respectively. Only part of the stacked plurality of inductors 112a to 112c can be used when a test of the internal circuit 124 is conducted via the input/output terminal 124a which is connected to the bonding pad 110 formed thereabove while the remaining inductors are used for input/output of signals to/from other terminals.

Also in this embodiment, each of the inductors 112a to 112c may be formed of a conductor which is formed of a single layer. The stacked inductors 112a to 112c are not electrically connected to one another. In this embodiment, the inductors 112a to 112c are used for short distance communication, and hence a very high Q value is not necessary. Therefore, even if the inductors are formed of a conductor which is formed of a single layer, signals can be transmitted/received without any problems.

Figure 8A:
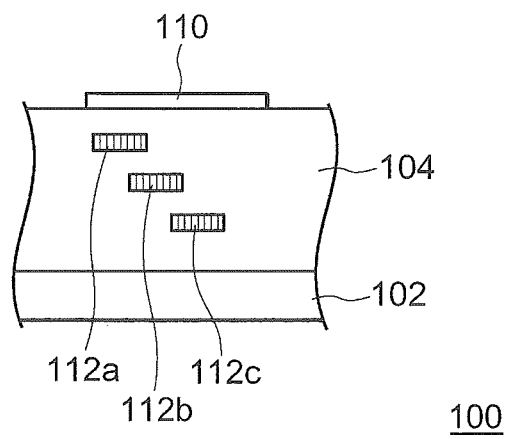
FIGS. 8A and 8B illustrate an exemplary structure of a semiconductor device according to a third embodiment of the present invention.

FIG. 8A is a sectional view illustrating an exemplary structure of a semiconductor device 100 according to a third embodiment of the present invention.

In this embodiment, a plurality of inductors are provided below each of the bonding pads 110 similarly to the case illustrated in FIG. 6, but this embodiment is different from the embodiment described with reference to FIG. 6 in that the inductors are provided at locations shifted from one another in the plan view.

Figure 8B:
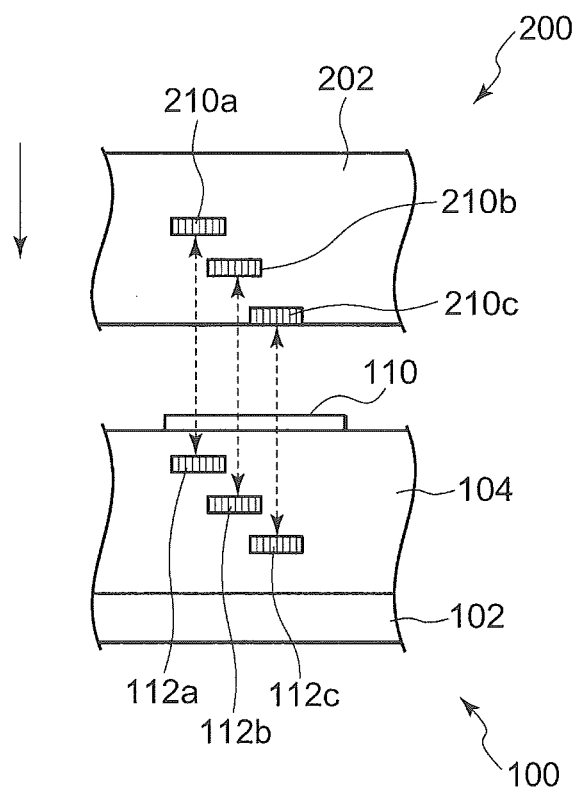

FIG. 8B is a sectional view illustrating a structure of a tester 200 for supplying a signal to the semiconductor device 100 according to the third embodiment of the present invention.

When the semiconductor device 100 has the structure as illustrated in FIG. 8A, inductors of the tester 200 are provided at locations corresponding to the inductor 112a, the inductor 112b, and the inductor 112c of the semiconductor device 100, which are shifted from one another in the plan view. Here, the inductor 210c on the tester side, the inductor 210b on the tester side, and the inductor 210a on the tester side may be adapted to input/output signals to/from the inductor 112c, the inductor 112b, and the inductor 112a, respectively, of the semiconductor device 100. Such a structure described above can make easier communication between an inductor of the semiconductor device 100 and an inductor of the tester 200 which transmits/receives a signal having the same phase.

Figure 9A:
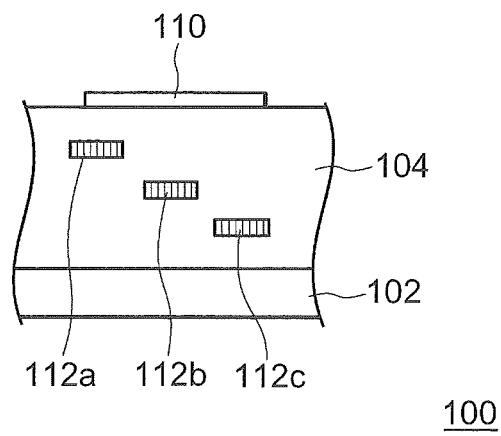
FIGS. 9A and 9B illustrate an exemplary structure of a semiconductor device according to a fourth embodiment of the present invention.

FIG. 9A is a plan view illustrating an exemplary structure of a semiconductor device 100 according to a fourth embodiment of the present invention.

In this embodiment, similarly to the embodiment illustrated in FIGS. 8A and 8B, a plurality of inductors are provided at locations shifted from one another in the plan view, but this embodiment is different from the embodiment described with reference to FIGS. 8A and 8B in that the inductors are provided so as not to overlap one another in the plan view. Further, part of the inductors lie off an outer edge of each of the bonding pads 110 in the plan view.

Figure 9B:
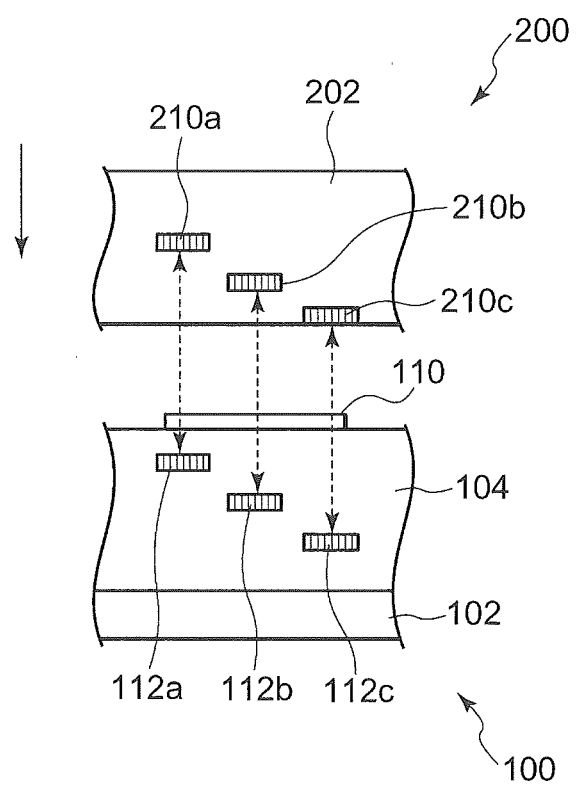

FIG. 9B is a sectional view also illustrating a structure of a tester 200 for supplying a signal to the semiconductor device 100 according to the fourth embodiment of the present invention.

When the semiconductor device 100 has the structure as illustrated in FIG. 9A, inductors of the tester 200 are provided at locations corresponding to the inductor 112a, the inductor 112b, and the inductor 112c of the semiconductor device 100. Here, the inductor 210c on the tester side, the inductor 210b on the tester side, and the inductor 210a on the tester side may be adapted to input/output signals to/from the inductor 112c, the inductor 112b, and the inductor 112a, respectively, of the semiconductor device 100. Such a structure described above can make easier communication between an inductor of the semiconductor device 100 and an inductor of the tester 200 which transmits/receives a signal having the same phase. Further, also in this case, because the inductors are provided so as to be superimposed on each of the bonding pads 110 in the semiconductor device 100, increase in chip size can also be suppressed.

Figure 10:
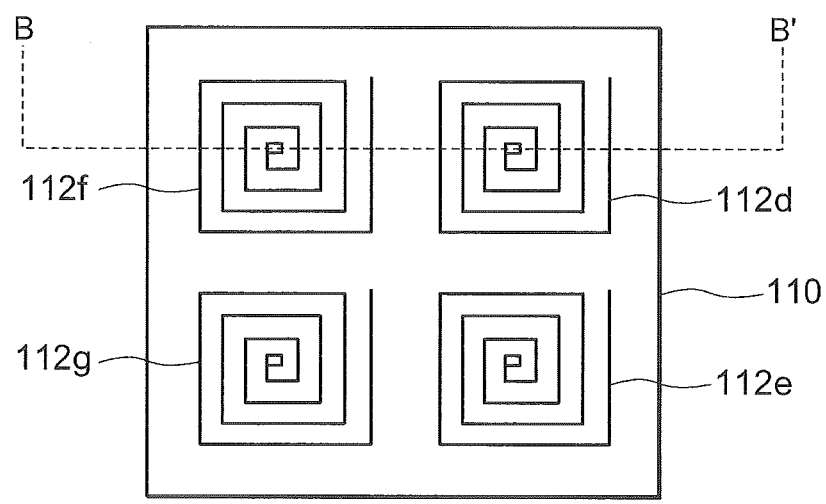
FIG. 10 is a plan view illustrating an exemplary structure of a semiconductor device according to a fifth embodiment of the present invention.
Figure 11A:
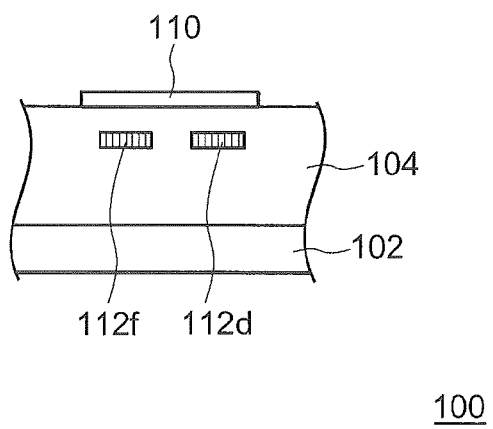
FIGS. 11A and 11B are sectional views taken along the line B-B' of FIG. 10.
Figure 11B:
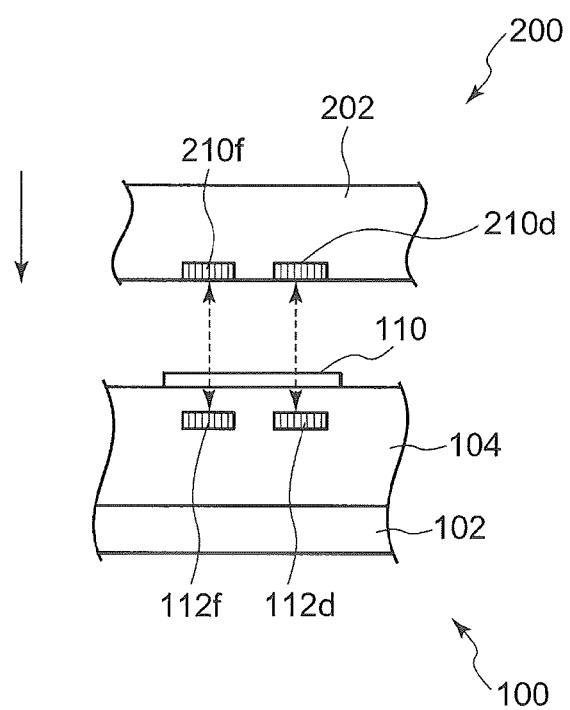

FIG. 10 is a plan view illustrating an exemplary structure of a semiconductor device 100 according to a fifth embodiment of the present invention. FIGS. 11A and 11B are sectional views taken along the line B-B' of FIG. 10.

In this embodiment, a plurality of (four) inductors, i.e., an inductor 112d, an inductor 112e, an inductor 112f, and an inductor 112g are formed under each of the bonding pads 110. The inductor 112d, the inductor 112e, the inductor 112f, and the inductor 112g are formed in the same layer.

FIG. 11B is a sectional view also illustrating a structure of a tester 200 for supplying a signal to the semiconductor device 100 according to the fifth embodiment of the present invention.

Here, only an inductor 210f on the tester side and an inductor 210d on the tester side which correspond to the inductors 112f and 112d, respectively, are illustrated, but the tester 200 includes a plurality of (four) inductors provided at locations corresponding to the inductor 112d, the inductor 112e, the inductor 112f, and the inductor 112g, respectively, of the semiconductor device 100. When the size of the inductors is smaller than that of the bonding pads 110, such a disposition described above can further suppress increase in chip size.

The embodiments according to the present invention have been described above with reference to the drawings, but those embodiments only exemplify the present invention and various structures other than the above may also be adopted.

Further, in the above-mentioned embodiments, the case has been described in which the signal transmitting/receiving portion such as the inductors are used when, in a test of the internal circuit of the semiconductor device which is conducted at a wafer level, various test signals are received/transmitted from/to an external tester in a non-contact manner, but the present invention may also be used when, after chips are formed, various kinds of signals are transmitted/received in a non-contact manner.

Further, it is not necessary that the signal transmitting/receiving portion be provided under all the bonding pads 110 included in the semiconductor device 100. Further, a plurality of stacked or overlapping signal transmitting/receiving portions may be provided under only part of the bonding pads 110. Still further, it is not necessary that all the signal transmitting/receiving portions such as the inductors provided under the bonding pads 110 be used for wireless communication with an external device such as the tester 200. In this case, as a matter of course, the tester 200 also does not include an inductor on the tester side which corresponds to a signal transmitting/receiving portion which is not used for wireless communication.

It is apparent that the present invention is not limited to the above embodiments, but may be modified and changed without departing from the scope and spirit of the invention.

What is claimed is:
1. A semiconductor device, comprising:
a substrate;
an internal circuit including a plurality of transistors provided over the substrate;
an insulating film provided over the substrate; and
a bonding pad provided over the insulating film;
an inductor being formed in the insulating film, the inductor carrying out a signal transmission/reception to/from an external device in a non-contact manner by an electromagnetic induction and being electrically coupled to the internal circuit, wherein the inductor comprises a first conducting layer, and the bonding pad comprises a second conducting layer, wherein the first conducting layer comprises a lower level layer than the second conducting layer in a thickness direction of the substrate, and wherein, in a plan view, the inductor includes a first portion overlapping the bonding pad and a second portion not overlapping the bonding pad.

2. A semiconductor device according to claim 1, wherein the inductor is connected to a corresponding gate of the plurality of transistors of the internal circuit.

3. A semiconductor device according to claim 1, further comprising a bonding wire, wherein the bonding wire is connected to the bonding pad.

4. A semiconductor device according to claim 3, wherein the signal transmission/reception to/from the external device is performed through the bonding wire.

5. A semiconductor device according to claim 1, wherein the inductor carries out signal transmission/reception to/from another inductor opposite to the substrate in a non-contact manner by the electromagnetic induction.

* * * * *